(12) United States Patent
Losic (10) Patent No.: US 7,869,554 B2
(45) Date of Patent: Jan. 11, 2011

(54) PHASE/FREQUENCY ESTIMATOR-BASED PHASE LOCKED LOOP

(75) Inventor: Novica A. Losic, Waterloo (CA)

(73) Assignee: Honeywell International Inc., Morristown, NJ (US)

( * ) Notice: Subject to any disclaimer, the term of this patent is extended or adjusted under 35 U.S.C. 154(b) by 879 days.

(21) Appl. No.: 11/758,905

(22) Filed: Jun. 6, 2007

(65) Prior Publication Data

US 2008/0304609 A1 Dec. 11, 2008

(51) Int. Cl.
*H04L 7/04* (2006.01)
*H03L 7/08* (2006.01)

(52) U.S. Cl. .................. 375/376; 327/156
(58) Field of Classification Search ............... 375/326, 375/327, 373, 375, 376; 327/145–147, 155, 327/156
See application file for complete search history.

(56) References Cited

U.S. PATENT DOCUMENTS

| 4,495,475 A | * | 1/1985 | Mark et al. | 331/12 |
| 4,771,250 A | | 9/1988 | Statman et al. | |
| 6,046,645 A | | 4/2000 | Cucchi et al. | |
| 6,137,326 A | | 10/2000 | Ogawa | |
| 2001/0038316 A1 | * | 11/2001 | Kondoh | 331/17 |
| 2005/0046489 A1 | * | 3/2005 | Cranford et al. | 331/25 |

* cited by examiner

*Primary Examiner*—Young T. Tse
(74) *Attorney, Agent, or Firm*—Oral Caglar, Esq.

(57) ABSTRACT

A phase/frequency estimator-based phase locked loop (PFE-PLL) may be use to obtain a phase and frequency estimation by using an algebraic summer, a gain block and a (co)sine waveform generator. The apparatus and methods of the present invention may provide the phase estimation of an input signal from which a frequency of the signal is estimated by a derivative function. Unlike conventional phase lock loop systems, which may use a multiplier to perform complex calculations on an input and a feedback signal to develop a demodulated voltage output, the present invention may use a simple algebraic summer to provide an error signal and output a phase and a frequency estimation of the input signal.

16 Claims, 6 Drawing Sheets

PHASE/FREQUENCY ESTIMATOR-BASED PHASE LOCKED LOOP

BACKGROUND OF THE INVENTION

The present invention generally relates to apparatus and methods for phase and frequency estimation of a time domain signal and, more specifically, to a phase locked loop (PLL)-based apparatus and methods for phase and frequency estimation.

It is well recognized that it is desirable to be able to transmit synchronously digital signals from one node to another in a digital transmission system. However, if the average rate of transmission of bits from a node is not exactly equal to the average rate incoming to the node, errors occur. Such errors are defined as slips. A slip means that bits are arbitrarily deleted if the input transmission rate exceeds the output rate, or that bits are repeated or inserted arbitrarily if the input transmission rate is slower than the output rate. To assure synchronization and avoid slips, the nodes must be synchronized to a common reference signal. To this end, each node includes a local timing signal generator, commonly referred to as a local clock, which generates timing signals at a predetermined frequency. The local clock is adjusted to be in synchronization with a reference signal.

Figure 1:
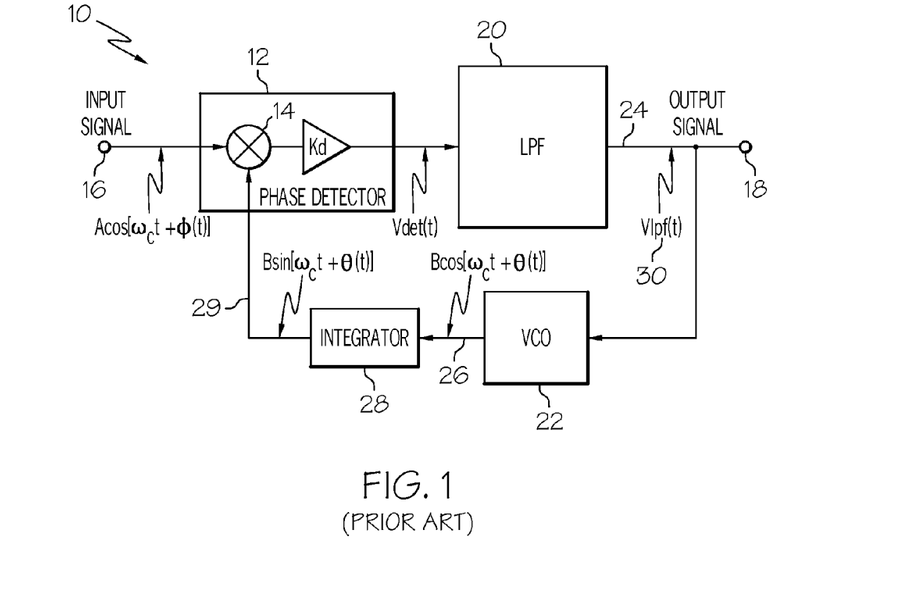
FIG. 1 is a block diagram showing a conventional phase locked loop.

Referring to FIG. 1, there is shown a conventional linear phase locked loop (PLL) 10. In its most fundamental form, a phase detector 12 in the conventional PLL 10 is a four-quadrant multiplier 14. An input signal 16 may be a frequency/phase modulated (co)sinusoidal (shown as cosinusoidal, but could be a sinusoidal waveform as well) waveform, such as A cos $[(\omega_c t+\phi(t)]$, wherein A is the amplitude of the waveform, $\omega_c t$ is the phase due to the carrier frequency $\omega_c$ and $\phi(t)$ is the initial phase of the waveform. An output signal, Vdet(t), of the phase detector 12, consists of signals operating on both the sum and the difference of the input and feedback signal phases:

$$Vdet(t)=(\tfrac{1}{2})ABK_d\{\sin [2\omega_c t+\phi(t)+\Theta(t)]+\sin [\phi(t)-\Theta(t)]\},$$

wherein B is the amplitude of an output of a voltage-controlled oscillator (VCO) 22, described below, $K_d$ is a gain constant, and $\Theta(t)$ is the feedback initial phase.

A lowpass filter 20 may be used to eliminate the sum and pass the phase difference as a driving voltage for the VCO 22. Due to the negative feedback loop operation, the error signal proportional to the phase difference between the input 16 and a feedback 29 signal, is forced close to zero, i.e., $$\sin [\phi(t)-\Theta(t)]\approx 0$$

therefore ensuring operating in the linear portion of the otherwise nonlinear (sine) transfer characteristic of the phase detector 12 when the loop is in lock, i.e., when the output phase $\Theta(t)$ tracks the input phase $\phi(t)$. The VCO 22 generates an output/reference signal 26, B cos $[\omega_c t+\Theta(t)]$, which is used to close the loop 10. Since the VCO output signal 26 is expressed in terms of frequency in rad/sec, an integration is assumed to follow the VCO with an integrator 28. The integrator 28 supplies the phase detector 12 with phase information. Therefore, both of the inputs of the phase detector 12, the input signal 16 and the output 29 of the integrator 28 contain phase information.

As a byproduct of the PLL action, a voltage signal 30 proportional to the change in frequency/phase of the input signal 16 is generated at the lowpass filter output 24 and this voltage represents the system's actual output voltage signal 30, Vlpf(t). Thus, for the input signal, which is frequency- or phase-modulated, this voltage signal 30 becomes the demodulated output of the PLL.

A typical conventional PLL, as shown above, uses a four-quadrant multiplier, e.g., multiplier 14, which results in multiple, complex sums, e.g., between the input signal 16 and the integrator output signal 29, requiring substantial computer processor resources to affect these sums.

As can be seen, there is a need for a simple phase/frequency estimation apparatus and method which may use a simpler, less processor intensive means for obtaining this estimation.

SUMMARY OF THE INVENTION

In one aspect of the present invention, a phase frequency estimator-based phase locked loop comprises an algebraic summer receiving an input signal; a (co)sine generator outputting a waveform based on the phase of a (co)sine generator input, a (co)sine generator output being received by the algebraic summer; an error signal being output by the algebraic summer; and a gain block for presenting the gain to the error signal.

In another aspect of the present invention, a method of determining characteristics of an input signal comprises passing the input signal into an algebraic summer; comparing, in the algebraic summer, the input signal to a signal from a feedback loop to give an output error signal; and passing the output error signal through a gain block to give an output signal from which phase information is estimated.

In a further aspect of the present invention, a method for determining the phase and frequency of a time domain signal using a phase-frequency estimator-based phase locked loop comprises passing the time domain signal into an algebraic summer; comparing, in the algebraic summer, the time domain signal to a signal from a feedback loop to give an output error signal; passing the output error signal through a gain block to give an output signal from which phase information of the time domain signal is estimated; and taking the derivative of the output signal to give a frequency estimate of the time domain signal, thereby qualifying the phase-frequency estimator-based phase locked loop as a frequency to voltage converter.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides a phase/frequency estimator-based phase locked loop (PFE-PLL). The present invention may provide both apparatus and methods of obtaining the phase and frequency (often referred to herein as "phase/frequency") estimation by using an algebraic summer, a gain block and a (co)sine waveform generator. The apparatus and methods of the present invention may provide the phase estimation of an input signal from which a frequency of the signal is estimated by a derivative function. The present invention may find use in any electric application where matching phase and frequency may be important. For example, with recent trends toward more electric architecture (MEA) of aircraft, aircraft electric power systems, including motor controllers and generator controllers, may benefit from the PFE-PLL of the present invention.

Unlike conventional phase lock loop systems, which may use a multiplier to perform complex calculations on an input and a reference signal to develop a demodulated voltage output, the present invention may use a simple algebraic summer to provide an error signal and output a phase and a frequency estimation of the input signal.

Figure 2:
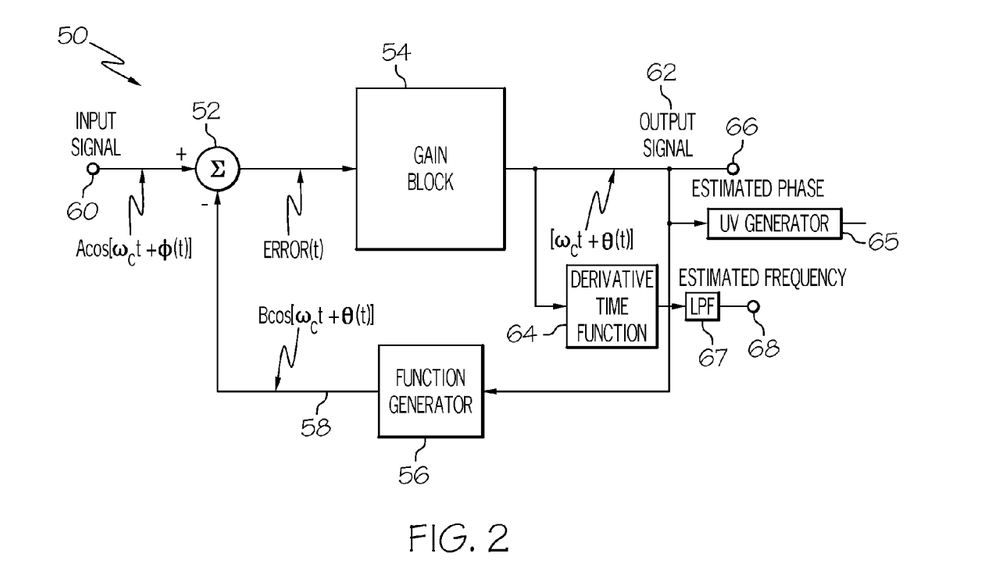
FIG. 2 is a block diagram showing a phase/frequency estimator-based phase locked loop according to the present invention.

Referring to FIG. 2, there is shown a block diagram of a phase/frequency estimator-based phase locked loop (PFE-PLL) 50. The PFE-PLL 50 may include an algebraic summer 52, a pure gain block 54 and a (co)sine waveform generator 56. An input signal 60 may be operated on by the algebraic summer 52 and compared to a signal from the (co)sine generator 56 by a simple algebraic sum of the two signals (input signal 60 and the signal from the (co)sine generator 56). The (co)sine generator 56 may be similar to a conventional VCO in that the (co)sine generator 56 may generate oscillations based on the phase of an input signal (in this case, the input signal of (co)sine generator 56 may be the output signal 62). The error signal, ERROR(t), output from the algebraic summer 52 may be operated on by the pure gain block 54 in order to present a gain to the error signal ERROR(t). The output of the gain block forms the output signal 62.

Due to closing the negative feedback loop 58, ERROR(t) ≈0, from which A cos [$\omega_c$t+φ(t)]≈B cos [$\omega_c$t+Θ(t)], i.e., for B=A, Θ(t)≈φ(t), wherein A is the amplitude of the input signal 60, $\omega_c$t is the signal's phase due to frequency $\omega_c$ (either the frequency of the input signal 60 or the frequency of the signal in the negative feedback loop 58), φ(t) is the initial phase of the input signal 60 and Θ(t) is the initial phase of the signal in the negative feedback loop 58.

Thus, the output signal 62 may estimate the phase of the input signal 60 at an estimated phase output 66 by becoming its replica, and, therefore, may extract the phase information, e.g., location of the waveform with respect to time, from the input signal 60, where the degree of the estimation may be a function of the gain value applied at the pure gain block 54.

An estimated frequency output 68 of the input signal 60 may be produced by a derivative function 64 of the output signal 62 as shown in FIG. 2. Thus, the PFE-PLL 50 may also be used as a frequency-to-voltage (F/V) converter. The output from the derivative function 64 may be passed through a low pass filter 67 to remove noise from the estimated frequency signal. As described in more detail below, a unity vector (UV) production may be accommodated with the PFE-PLL 50. UV production may be necessary in both synchronous- and stationary-frame methods of field-decoupled control of electrical machines.

A monotonic rise of the estimated phase, instead of a piece-wise-periodic repetition to and from zero at every half period due to the even nature of a cosine signal, has been provided as shown in FIGS. 3-6 as shown and described below. The systems shown in the FIGS. 3-6 may normalize the input amplitude (which, in general, may be different from unity) and may use some noise reduction techniques. These interventions (normalization and noise reduction), however, may not affect the fundamental nature of the system of FIG. 2 in that the PFE-PLL 50 may function without them by forming a phase locked loop that locks its output signal phase/frequency onto the input signal phase/frequency.

Figure 3:
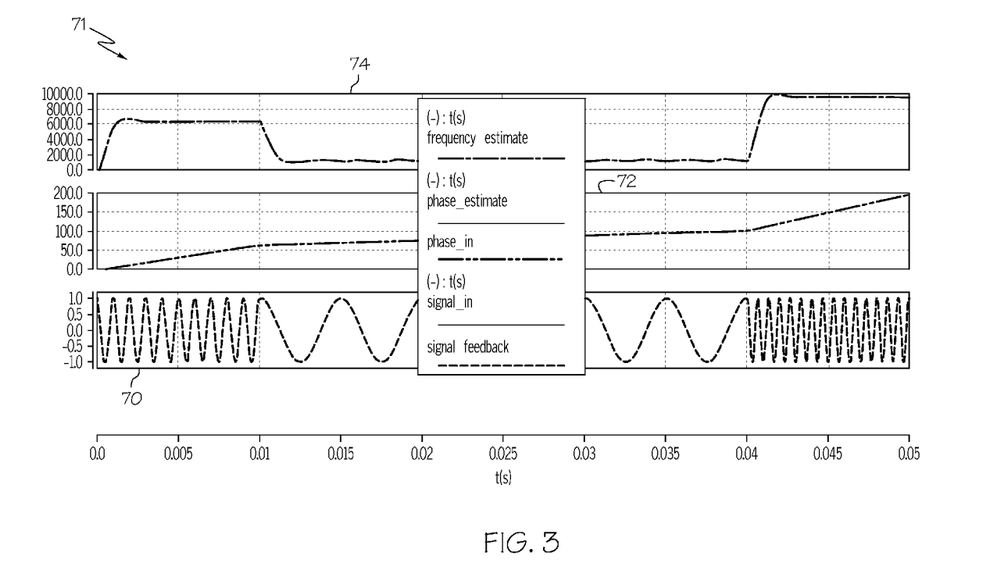
FIG. 3 is an output screen display showing a set of graphs depicting a continuous/analog application of the PFE-based PLL according to the present invention.

Referring now to FIG. 2 in connection with FIG. 3, there is shown an output screen display 71 showing a set of graphs depicting a continuous/analog application of the PFE-based PLL (e.g., PFE-PLL 50 of FIG. 2) according to the present invention. A bottom graph 70 shows one example of the feedback signal 58 overlapping the input signal 60. This input signal may start at 1 kilohertz (kHz) for 0.01 second (s), change to 200 Hz until 0.04 s, and then change to 1.5 kHz for another 0.01 s. The signal of the negative feedback loop 58 may closely match the input signal 60 such that the resolution of the graph 70 may not discern a difference. A middle graph 72 may show the output signal 62 which has a phase replicated from the phase of the input signal 60. In the middle graph 72, there may be no discernable difference between the phase in signal (the phase of the input signal 60) and the phase estimate signal (the phase of the output signal 62). A top graph 74 may show the output frequency estimate, which may be obtained via a derivative function 64. The graph 74 may output w, which is 2*π*frequency.

Figure 4:
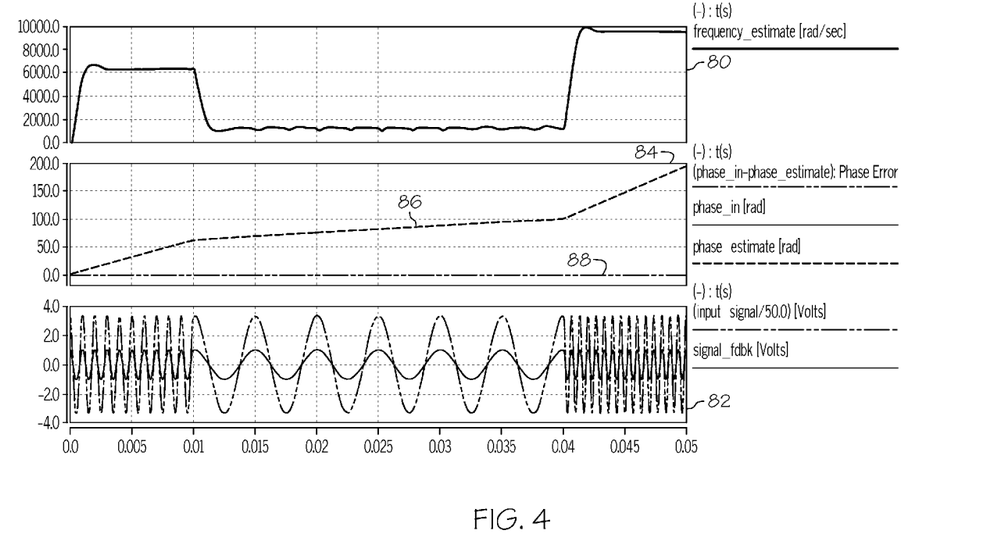
FIG. 4 is an output screen display showing a set of graphs depicting a continuous/analog application of the PFE-based PLL according to the present invention.

Referring now to FIG. 2 in connection with FIG. 4, there is shown another example of phase and frequency extraction according the present invention. In this case, the input signal 60 may not be a unity vector (in other words, has an amplitude that is not 1). The signal of the feedback loop 58 may be formed as a unity vector. By having the input signal 60 and the signal of the feedback loop 58 at different amplitudes, it may be easier to differentiate the two signals (unlike in FIG. 3, wherein there may be no discernable difference between the input signal and the signal of the feedback loop 58). A bottom graph 82 of FIG. 4 shows this differentiation. It may also be seen that the phase of the signal of the feedback loop 58 may replicate the phase of the input signal 60. A middle graph 84 of FIG. 4 may show the phase of the input signal 60 (phase in) and the phase of the output signal 62 (phase estimate) as an overlapping set of lines 86. Phase error (the difference between phase in and phase estimate) may be shown by a line 88 close to zero. A top graph 80 may show the output frequency estimate, which may be obtained via a derivative function 64. The graph 80 may show output ω, which is 2*π*frequency.

Figure 5:
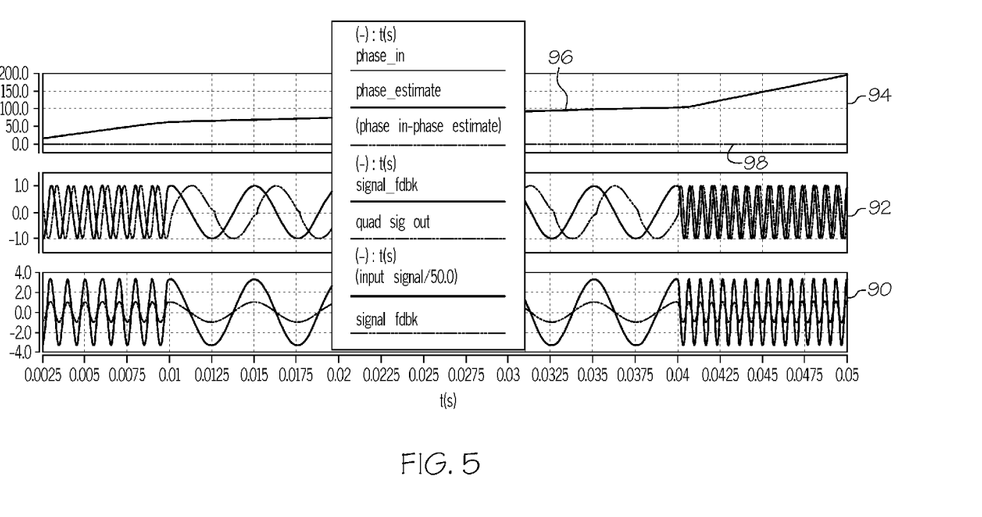
FIG. 5 is an output screen display showing a set of graphs depicting a continuous/analog application of the PFE-based PLL according to the present invention.

Referring to FIG. 2 in connection with FIG. 5, there is shown another example of phase and frequency extraction according the present invention. In this case, the input signal 60 may not be a unity vector (in other words, has an amplitude that is not 1). The signal of the feedback loop 58 may be formed as a unity vector. By having the input signal 60 and the signal of the feedback loop 58 at different amplitudes, it may be easier to differentiate the two signals (unlike in FIG. 3, wherein there may be no discernable difference between the input signal and the signal of the feedback loop 58). A bottom graph 90 of FIG. 5 shows this differentiation. It may also be seen that the phase of the signal of the feedback loop 58 may replicate the phase of the input signal 60.

A graph 92 in the middle of FIG. 5 may show the signal of the feedback loop 58 (signal_feedback) as a unity vector as was shown in the bottom graph 90. The signal_feedback may be superimposed with a quad_sig_out which may be formed, as is known in the art, as a unity vector by a unity vector generator 65 (see FIG. 2). The quad_sig_out and the signal_feedback may be in quadrature, or, in other words, may be out of phase by about 90 degrees.

A graph 94 at the top of FIG. 5 may show the phase of the input signal 60 (phase in) and the phase of the output signal 62 (phase estimate) as an overlapping set of lines 96. Phase error (the difference between phase in and phase estimate) may be shown by a line 98 close to zero.

Figure 6:
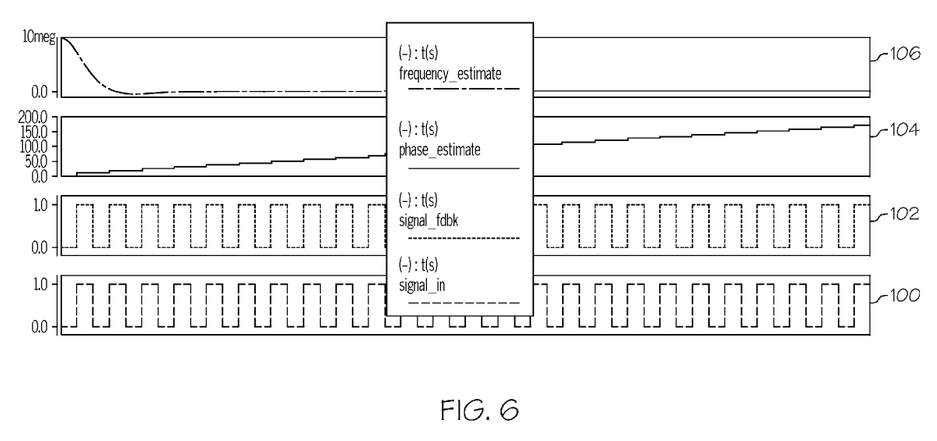
FIG. 6 is an output screen display showing a set of graphs depicting a digital/discreet application of the PFE-based PLL according to the present invention.

Referring now to FIG. 2 in connection with FIG. 6, there is shown another example of phase and frequency extraction of a discrete/digital application according the present invention. In this case, as shown in a bottom graph 100, the input signal 60 may be a unity vector (in other words, has an amplitude that is 1). The signal of the feedback loop 58, as shown in a middle graph 102 (second from the bottom) may be formed as a unity vector. It may be seen that the phase of the signal of the feedback loop 58 may replicate the phase of the input signal 60 as can be seen from comparing the bottom graph 100 and the middle graph 102. A middle graph 104 (second from the top) of FIG. 6 may show the phase of the output signal 62 (phase estimate). A top graph 106 may show the output frequency estimate, which may be obtained via a derivative function 64. The graph 106 may show output $\omega$, which is $2*\pi*$frequency.

Figure 7:
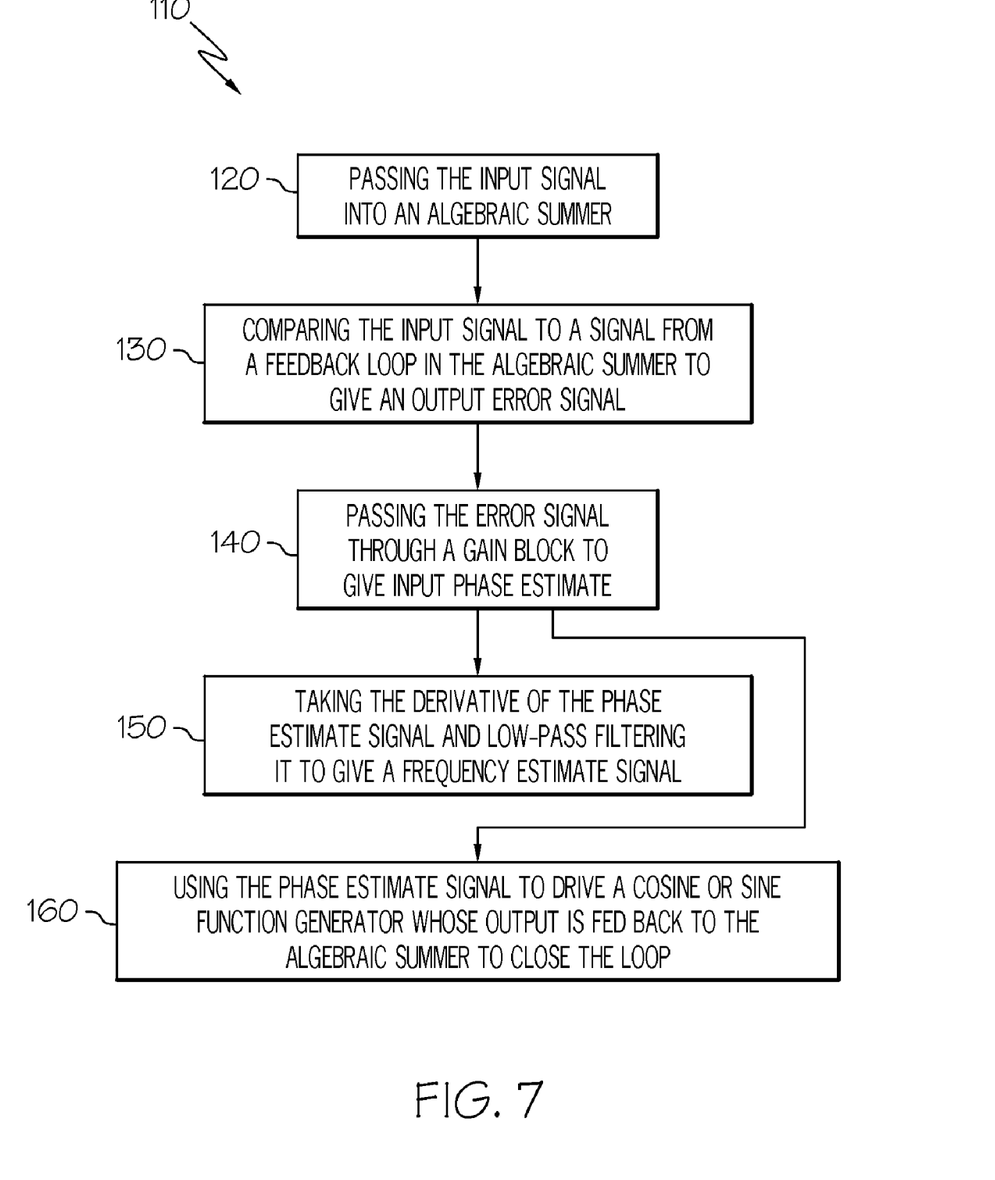
FIG. 7 is a flow chart showing a method according to the present invention.

Referring to FIG. 7, there is shown a flow chart describing a method 110 of determining characteristics of an input signal (e.g., input signal 60) according to the present invention. The method 110 may include a step 120 of passing the input signal into an algebraic summer (e.g., algebraic summer 52). A step 130 of comparing the input signal to a signal from a feedback loop (e.g., negative feedback loop 58) in the algebraic summer may give an output error signal (e.g., ERROR(t)). This output error signal may pass through a gain block (e.g., pure gain block 54) to give a signal (e.g., output signal 62) in a step 140. This signal may give the estimated phase (e.g., estimated phase output 66) from the PFE-PLL. An optional step 150 may include taking the derivative (e.g., via derivative function 64) of the signal, from step 140 above, to give a frequency estimate (e.g., estimated frequency output 68).

The phase estimate signal obtained in step 140 may be used in step 160 to drive a (co)sine waveform generator whose output is fed back to the algebraic summer (e.g., block 52 in FIG. 2) to close the loop.

It should be understood, of course, that the foregoing relates to exemplary embodiments of the invention and that modifications may be made without departing from the spirit and scope of the invention as set forth in the following claims.

I claim:

1. A phase and frequency estimator-based phase locked loop comprising:
    an algebraic summer receiving an input signal, the algebraic summer comparing the input signal to a function generator output signal, the algebraic summer generating an error signal;
    a gain block receiving the error signal and generating an output signal;
    a function generator receiving the output signal and generating the function generator output signal selected from a group consisting of sine and cosine, the function generator output signal having a waveform based on the phase of the output signal;
    a derivative function receiving the output signal and generating a noisy frequency estimation signal; and
    a low pass filter receiving the noisy frequency estimation signal and providing a frequency estimation signal.

2. The phase and frequency estimator-based phase locked loop of claim 1, wherein the input signal is a waveform having a trigonometric function selected from a group consisting of sine and cosine.

3. The phase and frequency estimator-based phase locked loop of claim 2, wherein the input signal is a unity vector.

4. The phase and frequency estimator-based phase locked loop of claim 2, wherein the input signal is not a unity vector.

5. The phase and frequency estimator-based phase locked loop of claim 4, wherein the input signal is normalized to an amplitude of the function generator output signal.

6. The phase and frequency estimator-based phase locked loop of claim 4, further comprising a unity vector generator for generating a unity vector from the output signal.

7. The phase and frequency estimator-based phase locked loop of claim 1, wherein the input signal is an analog signal.

8. The phase and frequency estimator-based phase locked loop of claim 1, wherein the input signal is a digital signal.

9. A method of determining characteristics of an input signal, the method comprising:
    comparing, by an algebraic summer, the input signal to a function generator output signal to generate an error signal;
    passing the error signal through a gain block to generate an output signal from which phase information is estimated;
    receiving, by a function generator, the output signal to generate the function generator output signal selected from a group consisting of sine and cosine;
    passing the output signal through a derivative function to provide a noisy frequency estimation signal; and
    passing the noisy frequency estimation signal through a low pass filter to generate a frequency estimation signal.

10. The method according to claim 9, further comprising passing the output signal through a unity vector generator to generate a signal in quadrature to the output signal.

11. The method according to claim 9, further comprising normalizing an amplitude of the function generator output signal.

12. The method according to claim 9, wherein the function generator output signal causes the phase of the output signal to replicate the phase of the input signal.

13. A method for determining the phase and frequency of a time domain signal using a phase and frequency estimator-based phase locked loop, the method comprising:
    comparing, by an algebraic summer, the time domain signal to a function generator output signal to generate an error signal;
    passing the error signal through a gain block to generate an output signal from which phase information of the time domain signal is estimated;
    generating the function generator output signal from the output signal, wherein the function generator output signal is selected from a group consisting of sine and cosine, the function generator output signal having a waveform based on the phase of the output signal;
    taking the derivative of the output signal to generate a noisy frequency estimation signal of the time domain signal, thereby qualifying the phase-frequency estimator-based phase locked loop as a frequency to voltage converter; and passing the noisy frequency estimation signal through a low pass filter to generate a frequency estimation signal.

14. The method according to claim 13, wherein the time domain signal is described by the formula $A \cos[\omega_c t + \Phi(t)]$, wherein A is the amplitude of the time domain signal, $\omega_c t$ is the phase of the time domain signal due to frequency $\omega_c$, and $\Phi(t)$ is the initial phase of the time domain signal.

15. The method according to claim 14, wherein the function generator output signal is described by the formula $B \cos[\omega_c t + \Theta(t)]$, wherein B is the amplitude of the output signal, $\omega_c t$ is the phase of the output signal due to frequency $\omega_c$, and $\Theta(t)$ is the initial phase of the time domain signal.

16. The method according to claim 15, wherein $A \cos[\omega_c t + \Phi(t)]$ is approximately equal to $B \cos[\omega_c t + \Theta(t)]$ for A normalized to B and, therefore, the error signal is approximately equal to zero.

* * * * *